United States Patent
Armbrust et al.

(10) Patent No.: US 6,773,952 B2
(45) Date of Patent: Aug. 10, 2004

(54) SEMICONDUCTOR CHIP STRUCTURES WITH EMBEDDED THERMAL CONDUCTORS AND A THERMAL SINK DISPOSED OVER OPPOSING SUBSTRATE SURFACES

(75) Inventors: Douglas S. Armbrust, Gloucester, MA (US); William F. Clark, Essex Junction, VT (US); William A. Klaasen, Underhill, VT (US); William T. Motsiff, Essex Junction, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/243,397

(22) Filed: Sep. 12, 2002

(65) Prior Publication Data

US 2003/0017650 A1 Jan. 23, 2003

Related U.S. Application Data

(62) Division of application No. 09/660,270, filed on Sep. 12, 2000, now Pat. No. 6,572,292.

(51) Int. Cl.[7] .............................................. H01L 21/00
(52) U.S. Cl. ........................... 438/54; 438/26; 438/106
(58) Field of Search ............................. 438/22, 26, 41, 438/48, 54, 106, 149, 214, 280, 348, 361, 411, 427, 479, 517, 619

(56) References Cited

U.S. PATENT DOCUMENTS

| | | | |
|---|---|---|---|
| 4,689,443 A | 8/1987 | Bailleul ........................ 174/102 |
| 4,800,420 A | 1/1989 | Chen et al. ..................... 357/76 |
| 4,970,578 A | 11/1990 | Tong et al. ..................... 357/81 |
| 5,037,782 A | 8/1991 | Nakamura et al. ........... 437/902 |
| 5,229,647 A | * 7/1993 | Gnadinger .................... 257/785 |
| 5,343,071 A | 8/1994 | Kazior et al. ................ 257/621 |
| 5,366,911 A | 11/1994 | Lur et al. ...................... 437/40 |
| 5,449,930 A | 9/1995 | Zhou ........................... 257/197 |
| 5,494,858 A | 2/1996 | Gnade et al. ................ 437/231 |
| 5,621,616 A | 4/1997 | Owens et al. ................ 361/704 |
| 5,744,865 A | 4/1998 | Jeng et al. .................... 257/750 |
| 5,777,365 A | 7/1998 | Yamaguchi et al. ......... 257/347 |
| 5,834,847 A | 11/1998 | Jung et al. ................... 257/773 |
| 5,982,039 A | 11/1999 | Jung et al. ................... 257/773 |
| 6,288,426 B1 | * 9/2001 | Gauthier, Jr. et al. ....... 257/347 |

FOREIGN PATENT DOCUMENTS

JP 7193122 A 12/1993

* cited by examiner

Primary Examiner—Amir Zarabian
Assistant Examiner—Pamela E Perkins
(74) Attorney, Agent, or Firm—Ronald A. Kaschak; Lawrence R. Fraley, Esq.; Heslin Rothenberg Farley & Mesiti P.C.

(57) ABSTRACT

Semiconductor chip structures are provided with embedded thermal conductors for removing heat from one or more electrically conductive circuit members thereof, wherein the circuit members are formed on one or more dielectric layers above a substrate, each layer having a low dielectric constant and a low thermal conductivity. One or more cooling posts, for example, multiple thermally conductive plugs, are selectively disposed within the semiconductor chip structure adjacent to one or more electrically conductive members and thermally coupled thereto so that heat produced by the members is transferred into and through the cooling posts for forwarding to the substrate and/or to an upper surface of the semiconductor chip structure. The backside of the substrate has a thermal sink thermally coupled thereto and electrically isolated from the substrate. The thermal sink includes one or more thermally conductive via structures embedded within the substrate and aligned to thermally contact to the cooling posts disposed above the substrate.

12 Claims, 5 Drawing Sheets

SEMICONDUCTOR CHIP STRUCTURES WITH EMBEDDED THERMAL CONDUCTORS AND A THERMAL SINK DISPOSED OVER OPPOSING SUBSTRATE SURFACES

CROSS-REFERENCE TO RELATED APPLICATION/PATENT

This application is a divisional of U.S. patent application Ser. No. 09/660,270, filed Sep. 12, 2000, entitled "Semiconductor Chip Structures With Embedded Thermal Conductors And A Thermal Sink Disposed Over Opposing Substrate Surfaces", now U.S. Letters Patent No. 6,572,292. issued Jan. 28, 2003. the entirety of which is hereby incorporated herein by reference.

This application also contains subject matter which is related to the subject matter of the following Letters Patent, which is assigned to the same assignee as this application. The below-listed Letters Patent is hereby incorporated herein by reference in its entirety:

U.S. Pat. No. 6,333,557, entitled "Semiconductor Chip Structures With Embedded Thermal Conductors," and issued Dec. 25, 2001.

TECHNICAL FIELD

This invention relates in general to reducing heat energy in semiconductor devices, and more particularly, to thermal conductors embedded within semiconductor chip structures for removing heat from one or more conductive circuit members thereof, wherein the conductive circuit members are disposed within or on a low k dielectric material having a low thermal conductivity. More specifically, the invention addresses the problem of removing heat generated by copper wiring within low dielectric glasses and nanofoams in semiconductor chip structures.

BACKGROUND OF THE INVENTION

Modern Very Large Scale Integrated (VLSI) chips require cooling to improve reliability of their circuitry and interconnects, to increase their circuit switching performance, and to regulate thermally generated noise in their circuits. Cooling reduces the likelihood that a metal wire will form voids or a contact will become open. It also reduces the extent of time-dependent transistor mobility and threshold degradation which adversely affects circuit performance and operation. Furthermore, in typical complementary metal oxide semiconductor (CMOS) microprocessors, every reduction in temperature of 10° C. produces a 2% rise in operating frequency. For CMOS transistors, high temperatures yield significantly larger leakage currents, due to the thermal generation of carriers. This deleterious current doubles every 11° C. and is known to adversely affect the functional operation of dynamic and analog circuits.

As VLSI circuits shrink to improve performance and increase operating frequencies, higher amounts of heat are generated, for example, due to constant switching of these devices. The removal of heat within a semiconductor chip structure thus becomes a major obstacle to the efficient performance of the device. Therefore, a need continues to exist for enhanced heat removal techniques for semiconductor devices.

SUMMARY OF THE INVENTION

In addition to the continued reduction in chip size, new materials are being incorporated to increase circuit performance. For example, dielectric materials with a dielectric constant (k) lower than that of conventional oxide reduce the parasitic capacitance between neighboring conductors, thereby improving circuit speed. However, most low k dielectrics are also lower in density than silicon oxide, and exhibit lower thermal conductivities as well thus further increasing the need for enhanced heat removal techniques.

Forming conductive lines and vias for semiconductor connections can be accomplished by a variety of methods. Prior techniques have used deposition and subtractive etch of metal to form conductive lines, followed by deposition of a dielectric layer and etch of vias therein to connect conductive lines above and below the dielectric layer. Newer techniques include damascene and dual damascene processes. In these techniques, a dielectric is deposited and patterned with trenches for conductive lines (in a damascene process) and for lines and vias (in a dual damascene process). Metal is then deposited and any metal overlying the dielectric outside of the vias and the trenches is removed by a chemical mechanical polish (CMP).

The metal that has traditionally been employed in such processes is aluminum. However, today's chips are designed to run very fast and two effects limiting speed are conductive line resistance and RC coupling induced delay due to higher wiring density and closer spacing of conductive wires. Copper, which has a lower resistance, is replacing aluminum for wiring of semiconductor chip structures. RC coupling is being addressed by the use of lower dielectric constant (low k) dielectrics, such as porous silicas or polyimide nanofoams to replace conventional silicon dioxide dielectrics. However, the combination of copper and low k porous material creates a problem with heat dissipation. Because of the improved resistance and lower RC coupling that a copper/low k dielectric combination affords, more power per unit time is applied to the line, significantly increasing the heat dissipation requirements. These porous low k materials characteristically do not provide heat dissipation as well as high density glass dielectrics. Therefore, as the temperature of copper lines continues to increase due to current flow, resistance also increases, degrading device performance. To add to the problem, certain low k dielectrics, especially organic foam dielectrics, will degrade both structurally and electrically at temperatures around 350° C. This temperature has been observed to be exceeded in copper wires on some products. Thus, there is a need for techniques which may be integrated with copper/low k dielectric semiconductor interconnection structures to improve the heat dissipation capability thereof so that device performance may be maintained optimal and consistent.

To summarize, therefore, the present invention comprises in one aspect a semiconductor chip structure which includes a substrate having first and second opposing surfaces, and at least one electrically conductive circuit member disposed above the first surface of the substrate. The at least one electrically conductive circuit member resides at least partially on a dielectric material, with the dielectric material being disposed between the at least one electrically conductive member and the substrate. The dielectric material has a low dielectric constant and a first thermal conductivity. The semiconductor chip structure further includes at least one thermal conductor thermally coupled to the at least one electrically conductive circuit member to provide a path for heat escape from the electrically conductive circuit member during operation. The at least one thermal conductor has a second thermal conductivity, and the second thermal conductivity is greater than the first thermal conductivity. A thermal sink is also provided thermally coupled to the second surface of the substrate, wherein the at least one thermal conductor facilitates heat transfer from the at least one electrically conductive circuit member to the thermal sink.

In a further aspect, a method of fabricating a semiconductor chip structure is provided. The method includes: providing a substrate having first and second opposing surfaces; forming at least one electrically conductive circuit member above the substrate on a dielectric layer, wherein the dielectric layer resides between the at least one electrically conductive circuit member and the substrate and has a low dielectric constant and a first thermal conductivity; disposing at least one thermal conductor thermally coupled to the at least one electrically conductive circuit member to provide a path for heat escape from the electrically conductive circuit member during operation, wherein the at least one thermal conductor has a second thermal conductivity, the second thermal conductivity being greater than the first thermal conductivity; and forming a thermal sink thermally coupled to the second surface of the substrate, wherein the at least one thermal conductor facilitates heat transfer from the at least one electrically conductive circuit member to the thermal sink.

To restate, semiconductor chip structures are described herein having one or more integrated thermal conductors for dissipating heat generated by conductive circuit members, for example wiring levels, disposed above the substrates of the chip structures. Each thermal conductor can comprise a thermally conductive plug or a stack of plugs which facilitate thermal coupling of heat produced by one or more conductive levels to the substrate of the chip structure and/or an upper surface of the structure. In one embodiment, the thermal conductors are placed in strategic locations within the semiconductor chip structures and either directly physically contact the circuit members to be cooled or pass close thereto so as to be thermally coupled to the members. As one example, the conductive circuit members reside on or within a first dielectric material having a first thermal conductivity and the stack of plugs comprise a second dielectric material having a second thermal conductivity, wherein the second thermal conductivity is at least 3× greater than the first thermal conductivity. More particularly, the present invention solves the problem of cooling semiconductor chip wiring when dielectrics having low thermal conductivity are used for interlevel isolation. The invention can be employed within a structure using copper wiring in combination with low k dielectric glasses and nanofoams.

As an enhancement, a thermal sink is thermally coupled to a second surface of the substrate opposite the first surface above which the conductive circuit members are disposed. The at least one thermal conductor is positioned to facilitate heat transfer from the at least one electrically conductive circuit member to the thermal sink disposed over the second surface of the substrate. Preferably, one or more thermally conductive via structures are formed in the substrate integral with the thermal sink for further facilitating thermal transfer from the at least one thermal conductor into the thermal sink.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The above objects, advantages and features of the present invention will be more readily understood from the following detailed description of certain preferred embodiments of the invention, when considered in conjunction with the accompanying drawings in which:

BEST MODE FOR CARRYING OUT THE INVENTION

The present invention builds upon the structures described in the above-incorporated, co-filed patent application entitled "SEMICONDUCTOR CHIP STRUCTURES WITH EMBEDDED THERMAL CONDUCTORS." In this co-filed disclosure, various semiconductor chip structures are described for dissipating heat generated by, for example, conductive lines in the wiring levels of the chip structures. The thermal conductors can comprise a thermally conductive plug or a stack of such plugs which facilitate thermal coupling of heat produced by one or more conductive lines to the substrate of the semiconductor chip structure and/or the upper surface thereof, for example, to a thermally conductive bump. The thermal conductors are placed in strategic locations in the semiconductor chip structure and either directly physically contact the conductive lines to be cooled or pass close thereto so as to be thermally coupled to the lines. Thermal conductors conduct heat away from the conductive lines towards the substrate and/or the upper surface of the semiconductor chip structure to enhance performance of the structure. Thermal conductors having high thermal conductivities are preferred and can comprise a dielectric material or an electrically conductive material, or even a combination of a dielectric liner surrounding an electrically conductive material. Each of the various thermal conductor embodiments described in the co-filed application can be employed in combination with the thermal cooling enhancements described hereinbelow.

The present invention employs a thermal sink thermally coupled to the backside of the semiconductor chip structure's substrate. The thermal sink includes one or more thermally conductive via structures formed in the substrate to thermally contact with the multiple thermal conductors extending through the wiring levels disposed above the substrate. The integrated thermal conductors facilitate heat transfer from one or more conductive circuit members disposed above the substrate to the one or more thermally conductive via structures of the thermal sink embedded in the backside of the substrate. Preferably, each via structure is aligned to a particular thermal conductor or cooling post disposed above the substrate for good thermal connection, but is also electrically isolated therefrom. As one example, the present invention provides semiconductor chip structures having integrated thermal conductors and a thermal sink for cooling lines having high current flows (such as power planes). The thermal conductors can comprise stacks of high conductivity material which may be formed of polysilicon, a high thermal conductivity dielectric, a metal (such as tungsten, copper, or aluminum), or combinations thereof. The thermal sink comprises a backside heat sink which is partially embedded within the substrate itself.

Figure 1:
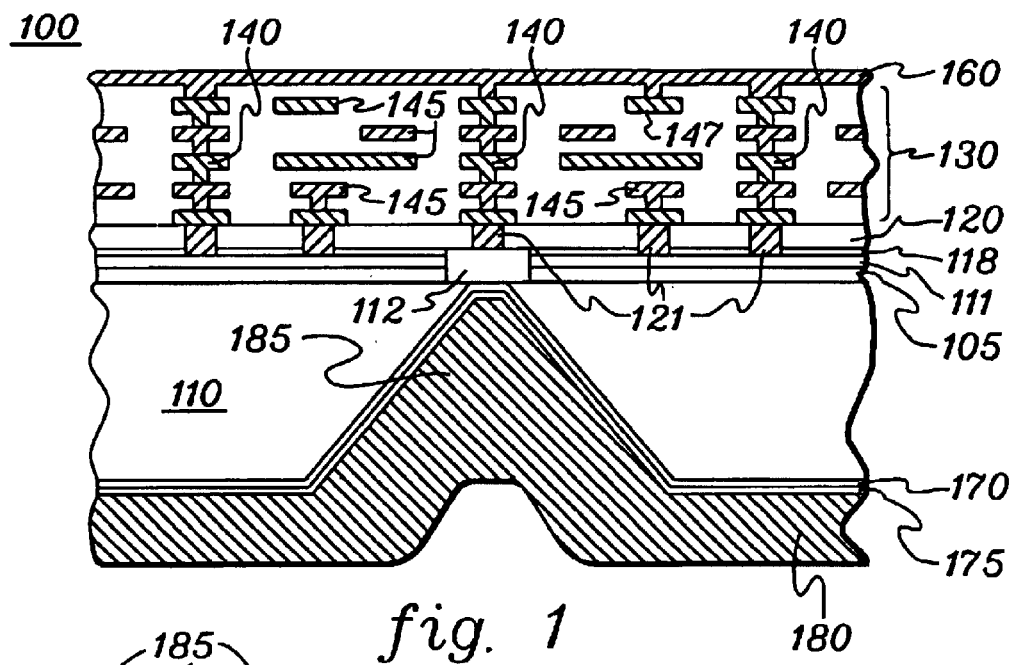
FIG. 1 is a cross-sectional elevational view of one embodiment of a semiconductor chip structure in accordance with the principles of the present invention.

FIG. 1 depicts one embodiment of a silicon-on-insulator (SOI) semiconductor chip structure 100 in accordance with the principles of the present invention. Structure 100 includes multiple cooling posts 140, 145 & 147 disposed above a first surface of substrate 110 and passing through multiple wiring levels 130. As described in the co-filed application, each cooling post can comprise a stack of trenches/vias which may comprise a high k dielectric material, an electrically conductive material, or a combination thereof. In this embodiment, an optional ground plane 160, besides being connected electrically to lines and devices within the SOI structure, thermally connects to various cooling posts 140, 147, some of which lead to tungsten studs within high k dielectric layer 120 on top of the SOI structure 110, 105. Further, in FIG. 1 a central cooling post 140 is coupled through a polysilicon contact 112 to a via structure 185 formed in substrate 110. Polysilicon is a good thermal conductor compared, for example, to the low k dielectric materials employed in the wiring levels through which cooling post 140 passes. In one example, via structure 185 comprises part of thermal sink 180, which may comprise a metal such as copper. In this embodiment, via structure 185 is electrically isolated from cooling post 140 by oxide layer 170 and nitride layer 175. Additional electrical breaks could be inserted into the cooling posts, for example, using a high thermal conductivity dielectric such as conventional silicon oxide.

Figure 2:
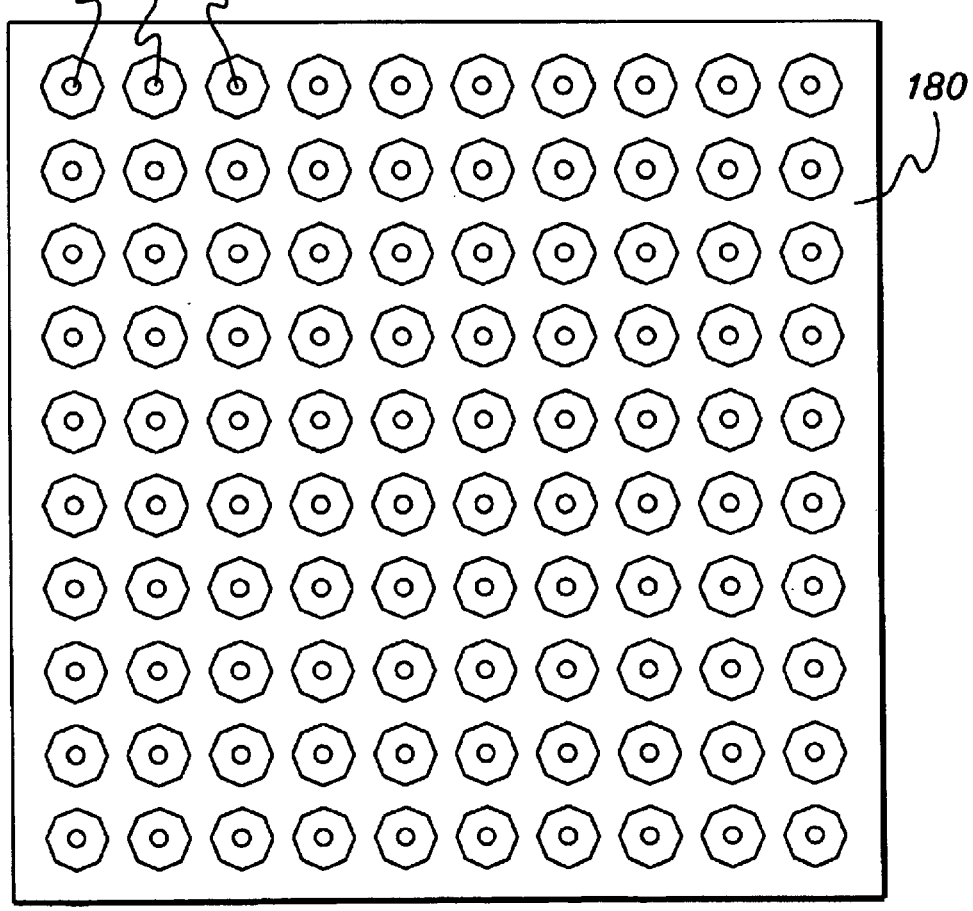
FIG. 2 is a plan view of a semiconductor chip structure in accordance with the principles of the present invention showing an array of embedded thermally conductive via structures disposed across the lower surface of the semiconductor chip structure.
Figure 3:
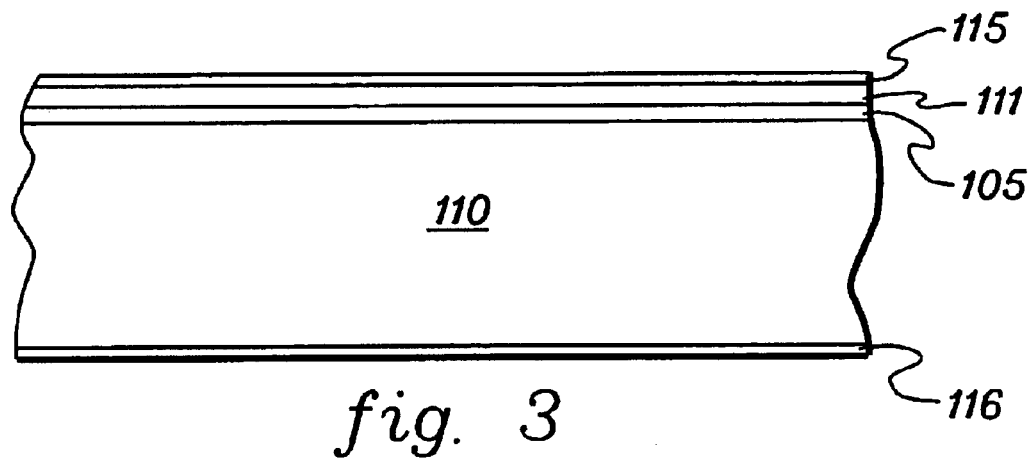
FIG. 3 is a cross-sectional elevational view of an intermediate silicon-on-insulator (SOI) structure attained during one fabrication embodiment of the semiconductor chip structure of FIG. 1.
Figure 4:
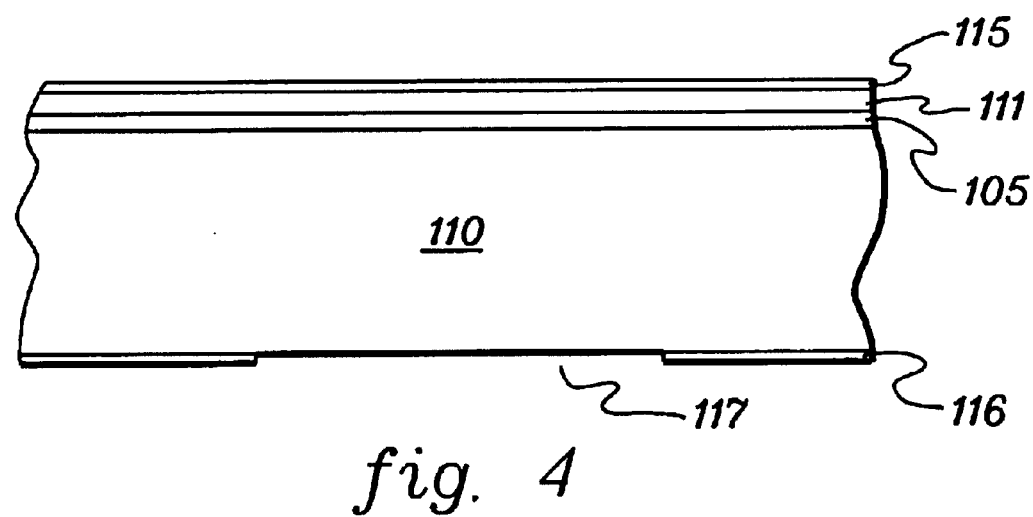
FIG. 4 is a cross-sectional elevational view of the structure of FIG. 3 after the nitride layer on the lower surface of the substrate has been patterned and etched to form a mask.

FIG. 2 is a plan view of one embodiment of the backside of semiconductor chip structure 100 showing thermal sink 180 with multiple thermally conductive via structures 185 arrayed across the surface. The geometry of the via structures is described below, but for a 20×20 mm semiconductor chip structure, an array of 10×10 of these via structures could be formed in a 750 micron thick substrate using currently available technology. The invention, however, as defined by the claims appended hereto is not limited to the particular configuration of via structures in FIG. 2, either individually or collectively as arranged across the backside of the substrate.

FIG. 1 depicts one embodiment of a silicon-on-insulator (SOI) semiconductor chip structure 100 in accordance with the principles of the present invention. Structure 100 includes multiple cooling posts 140, 145 & 147 disposed above a first surface of substrate 110 and passing through multiple wiring levels 130. As described in the co-filed application, each cooling post can comprise a stack of trenches/vias which may comprise a high k dielectric material, an electrically conductive material, or a combination thereof. In this embodiment, an optional ground plane 160, besides being connected electrically to lines and devices within the SOI structure, thermally connects to various cooling posts 140, 147, some of which lead to tungsten studs within high k dielectric layer 120 on top of the 501 structure 110, 105. Further, in FIG. 1 a central cooling post 140 is coupled through a polysilicon contact 112 to a via structure 185 formed in substrate 110. Polysilicon is a good thermal conductor compared, for example, to the low k dielectric materials employed in the wiring levels through which cooling post 140 passes. In one example, via structure 185 comprises part of thermal sink 180, which may comprise a metal such as copper. In this embodiment, via structure 185 is electrically isolated from cooling post 140 by oxide layer 170 and nitride layer 175. Additional electrical breaks could be inserted into the cooling posts, for example, using a high thermal conductivity dielectric such as conventional silicon oxide.

Figure 5:
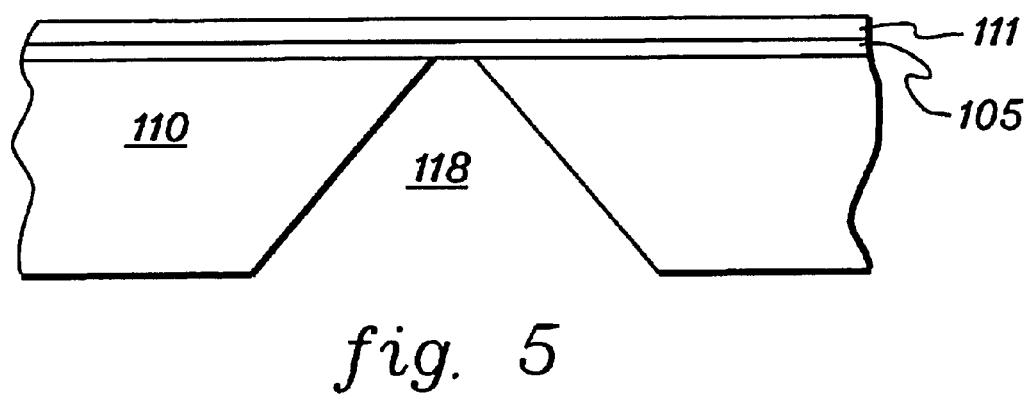
FIG. 5 is a cross-sectional elevational view of the structure of FIG. 4 after the substrate has been etched and the masking nitride layers removed.

In FIG. 5, the substrate silicon has been etched forming via 118 and the masking nitride layers 116 & 115 have been removed. The etch line has stopped on the SOI oxide 105. In one embodiment of the invention, the silicon substrate may have a <100> crystal orientation with the etchant being a very strong base. It is known in the art that strong bases will etch silicon at different rates along different crystal planes. If the wafer is of <100> crystal orientation, the "V" pattern illustrated will result. IBM Technical Disclosure Bulletins Vol. 16, No. 7, pages 2291–2292, December 1973 entitled Process for Etching Silicon describes one such etch. It is composed of 450 grams of tetramethyammonium hydroxide pentahydrate dissolved in 1 liter of water. At temperatures of 65–76° C. the etch rate of <100> silicon in the vertical direction is in the range of 3000 to 4000 Å per minute, while the lateral etch rate is approximately ⅙ of that. Both temperature and concentration control the etch rate. The sidewalls produced have a slope of approximately 55° when measured internally or 35° when measured from a line perpendicular to the surface. The cross-sectional geometry of the etched hole in a 750 micron thick substrate having a 10 micron flat at the SOI layer results in a 600 micron wide opening on the backside. Other etches such as alcoholic KOH (20% Aqueous KOH saturated with isopropanol at 80° C.) and Ethylenediame/Pyrocatechol/water mixtures are well known in the industry. It would also be possible to use Reactive ion etch (RIE).

Figure 6:
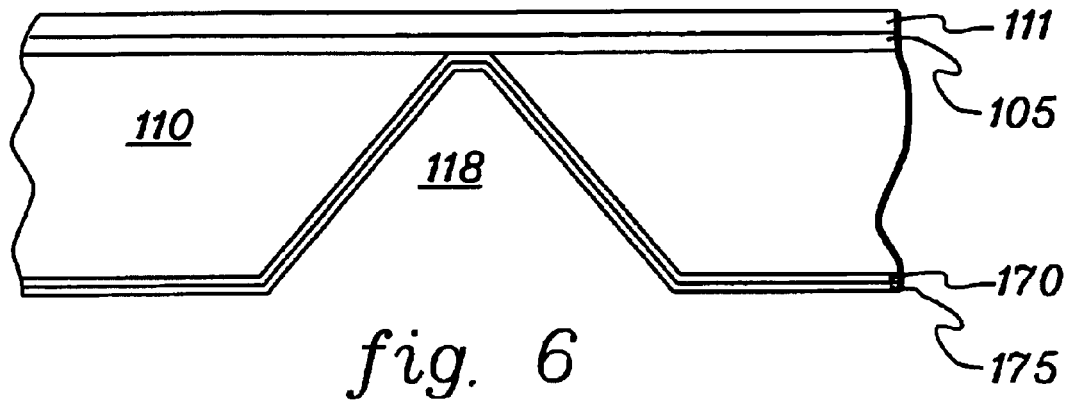
FIG. 6 is a cross-sectional elevational view of the structure of FIG. 5 after silicon oxide and silicon nitride layers have been formed on the backside of the substrate.
Figure 7:
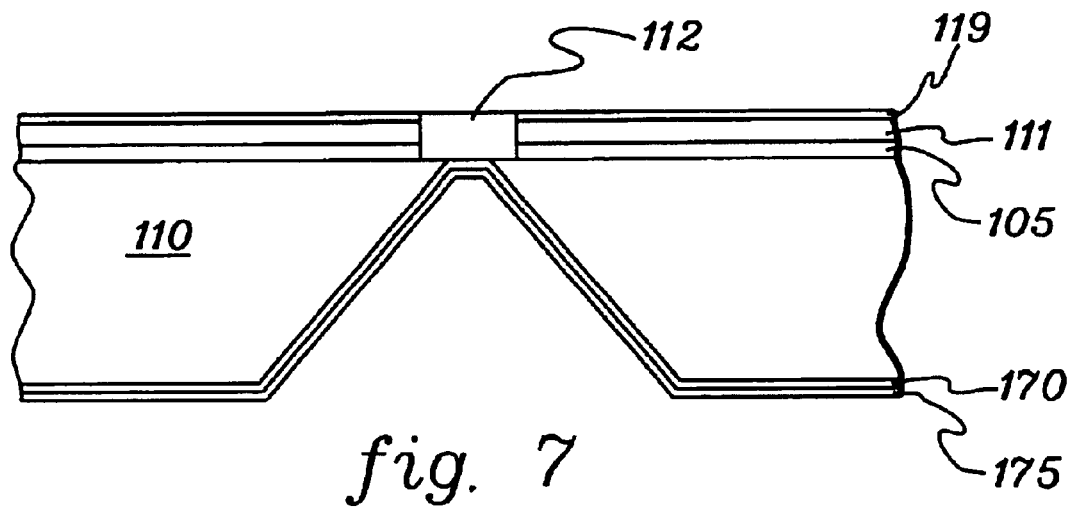
FIG. 7 is a cross-sectional elevational view of the structure of FIG. 6 after formation of a thermally conductive polysilicon plug in the silicon oxide layers above the substrate.
Figure 8:
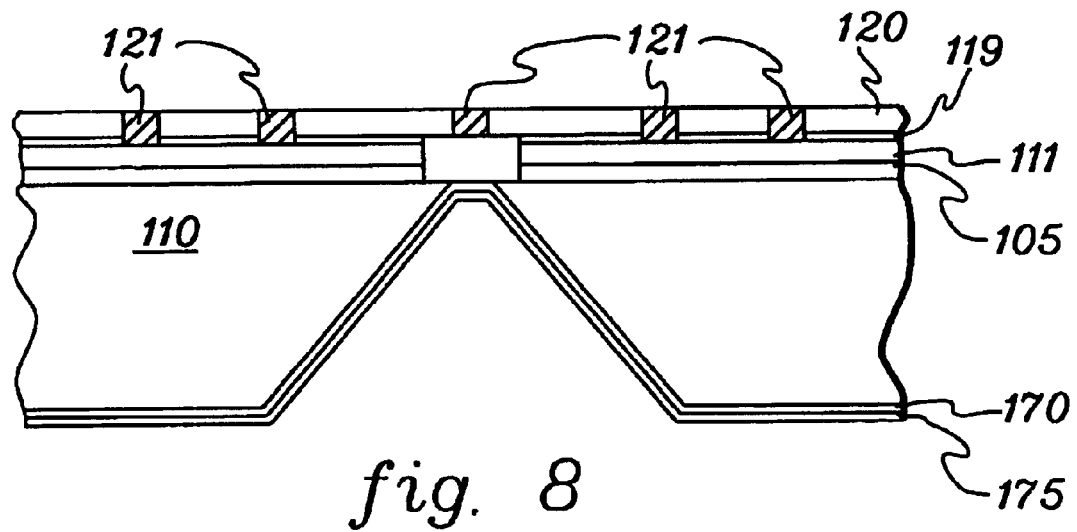
FIG. 8 is a cross-sectional elevational view of the structure of FIG. 7 after a high k dielectric layer has been formed and tungsten studs have been disposed therein to facilitate heat transfer from one or more electrically conductive circuit members to be positioned above the high k dielectric layer as shown in the more complete structure of FIG. 1.

In FIG. 6, an oxide layer 170 and nitride layer 175 have been formed on the backside of substrate 110. By way of example, oxide 170 and nitride 175 may each be 5000 Å thick. In FIG. 7, a polysilicon stud or plug 112 has been formed to align with via 118 in substrate 110 to function as a thermal conductor between the cooling posts to be formed thereabove and the via structure to be formed on the backside of the substrate (see FIG. 1). In FIG. 8, additional standard processing steps have been employed to form a high k dielectric layer above oxide 119 above the SOI structure. The high k dielectric layer 120 has been patterned with multiple tungsten studs 121 which facilitate good thermal connection to cooling posts to be disposed above the high k dielectric layer 120, as well as possible electrical connection to devices formed within the SOI structure. At this point, all high temperature processes are complete and the backside thermal sink may be formed at any time. The completed structure 100 in shown in FIG. 1. Thermal sink 180 can be formed by plated copper or an evaporated metal liner formed on top of the backside oxide/nitride layers.

In the various embodiments of this invention, multiple wiring levels are assumed to exist above the substrate within the semiconductor chip structures. In FIG. 1, the multiple wiring levels can reside in multiple low k dielectric layers such as described in the above-incorporated co-filed application. As a further alternative to ground plane 160 (FIG. 1) disposed above the cooling post, conductive bumps could be formed using pad limiting metallurgy disposed at openings in a passivation layer on top of the structure. The cooling post, which as noted above, can comprise various materials, can be formed using available processes such as damascene or dual damascene technology. Further, the principles described herein are applicable to sub-etched metallurgy as well.

The cooling posts in accordance with the invention can either be disposed in physical contact with one or more conductive lines of one or more wiring levels above the substrate (and in the example of FIG. 1, above the SOI structure) or adjacent to conductive lines in one or more wiring levels, provided that each cooling post is at least partially thermally coupled to a conductive line to ensure transfer of heat therefrom into the cooling post. Disposition of the cooling posts described herein depends upon the particular architecture of a given semiconductor chip structure. Formation of the cooling posts above high k dielectric layer 120 can proceed as described in the co-filed, and incorporated patent application entitled "SEMICONDUCTOR CHIP STRUCTURES WITH EMBEDDED THERMAL CONDUCTORS." Further, those skilled in the art will note that the semiconductor chip structures provided herein could be employed to cool any electrically conductive circuit member disposed above the surface of the substrate and is not necessarily limited to cooling conductive lines in the wiring levels of the structure.

By way of example, the high k dielectric layers discussed herein may have a dielectric constant $\geq 3.5$, with a typical value being $\geq 4$, and the low k dielectric layers presented may have a dielectric constant below 3.5, with a typical range being 2.5–2.7. A low k dielectric layer as discussed herein is assumed to comprise a low thermal conductivity layer, while a high k dielectric layer is assumed to comprise a highly thermally conductive layer. By way of further example, the thermally conductive plugs described may have greater than 3 times the thermal conductivity of the adjacent low k dielectric layers, with the thermal conductivity typically being $\geq 4\times$ that of the low k dielectric layers. As specific examples, the low k dielectric layers may comprise silsesquioxanes, while the high k dielectric layers could comprise silicon nitride or silicon dioxide.

Figure 9:
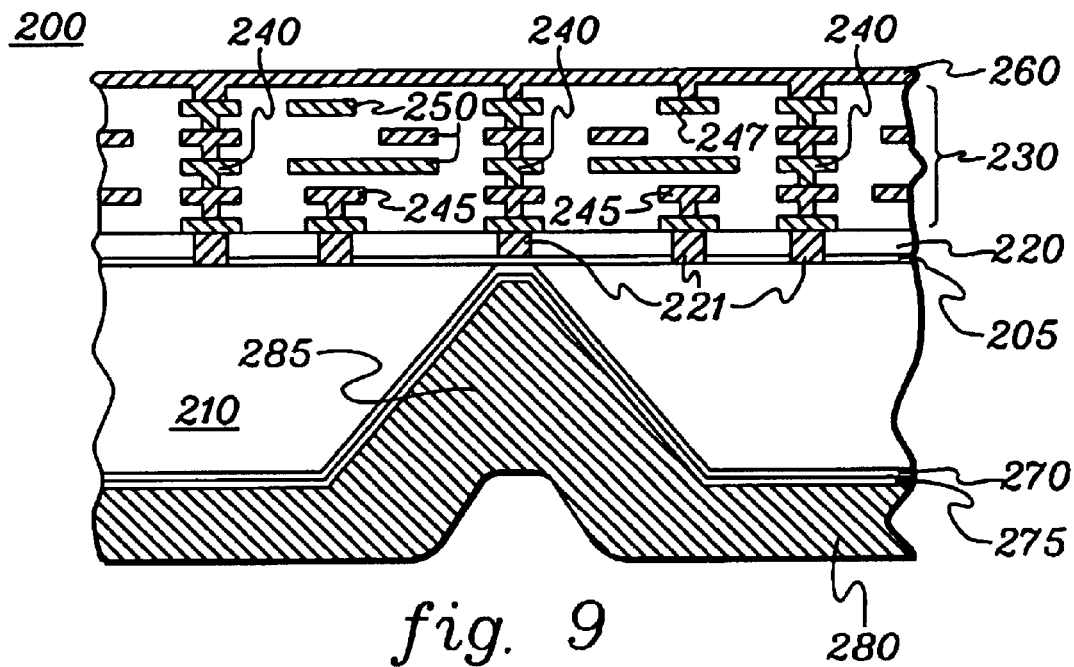
FIG. 9 is a cross-sectional elevational view of an alternate embodiment of a semiconductor chip structure in accordance with the principles of the present invention.

FIG. 9 depicts an alternate embodiment of a semiconductor chip structure 200 in accordance with the principles of the present invention. This embodiment is similar to structure 100 of FIG. 1 except for removal of the SOI layers and the polysilicon stud therethrough. Briefly summarized, multiple cooling posts 240, 245 & 247 are disposed within multiple layers 230 above a substrate 210. Layers 230 may comprise wiring levels having conductive lines 250 some of which may need to be cooled. In one embodiment, the wiring levels are disposed in a low k dielectric material thereby necessitating the enhanced cooling of the present invention. A thermally conductive via structure 285 is provided embedded within substrate 210 and forming part of a thermal sink 280 residing on the backside surface of substrate 210. Formation of layers 230, including cooling posts 240, 245 & 247 can be understood from the above-incorporated co-filed application. FIGS. 10–14 depict one embodiment for forming the remainder of the layers comprising structure 200.

Figure 10:
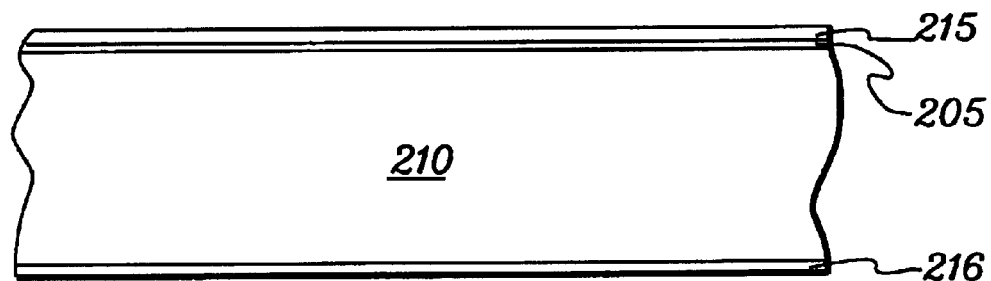
FIG. 10 is a cross-sectional elevational view of an intermediate structure attained during one fabrication embodiment of the semiconductor chip structure of FIG. 9.
Figure 11:
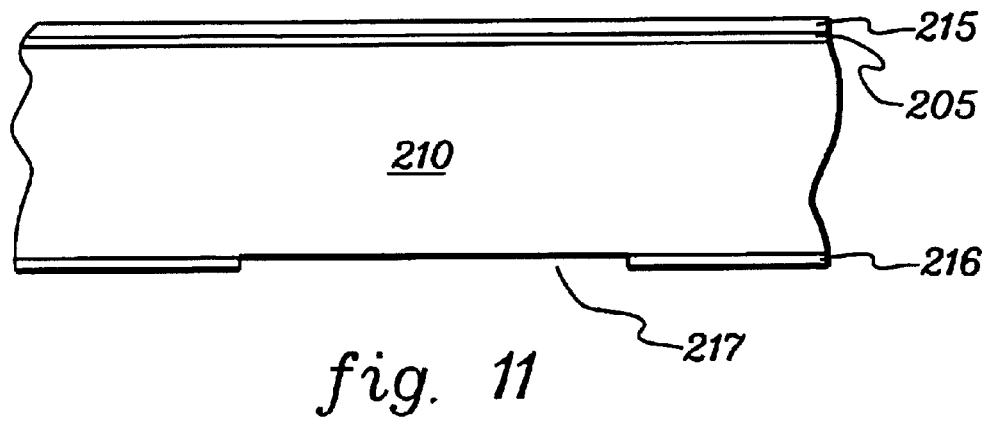
FIG. 11 is a cross-sectional elevational view of the structure of FIG. 10 after patterning and etching of the nitride layer on the lower surface of the substrate to form a mask.
Figure 12:
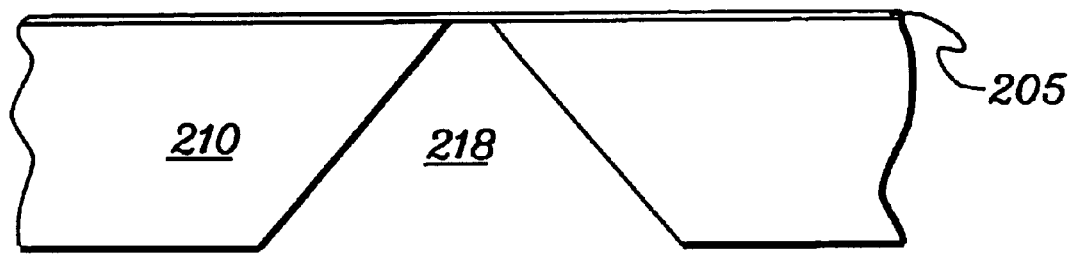
FIG. 12 is a cross-sectional elevational view of the structure of FIG. 11 after etching of the substrate and removal of the nitride masks.

In FIG. 10, a substrate 210 (e.g., 750 microns thick) has been provided, on top of which 700 Å/1200 Å of silicon oxide/silicon nitride (205/215) has been formed. On the underside of substrate 210 a 1200 Å silicon nitride layer 216 has also been formed. In FIG. 11, nitride layer 216 has been patterned 217 for use as an etch mask for formation of vias in the substrate that will become locations for the embedded via structures of the thermal sink. In FIG. 12, the substrate silicon has been etched, forming via 218, and the masking nitride layers 216 & 215 have been removed.

Figure 13:
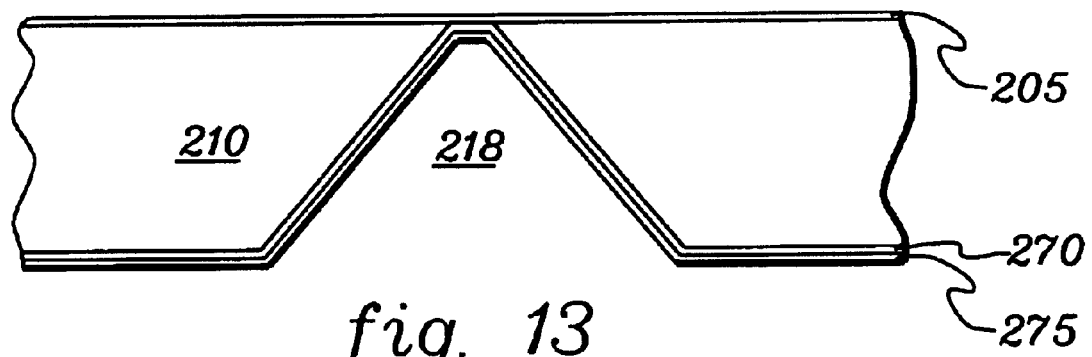
FIG. 13 is a cross-sectional elevational view of the structure of FIG. 12 after formation of silicon oxide and silicon nitride electrical isolation layers on the backside of the substrate.
Figure 14:
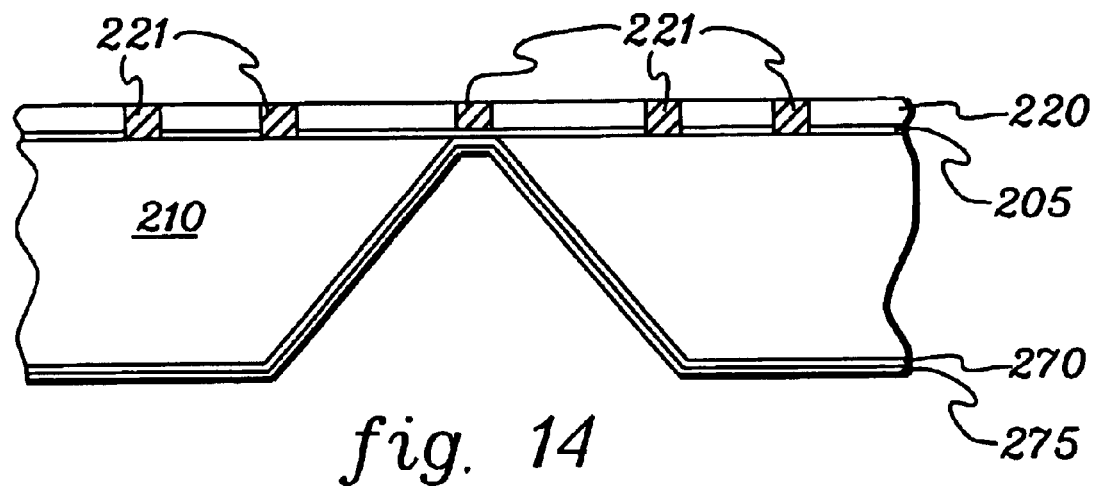
FIG. 14 is a cross-sectional elevational view of the structure of FIG. 13 after formation of a high k dielectric layer on the upper surface of the substrate and patterning and formation of tungsten studs in the high k dielectric layer to further facilitate thermal transfer between electrically conductive circuit members to be disposed above the high k dielectric layer and the substrate.

In FIG. 13, 5000 Å each of silicon oxide 270 and silicon nitride 275 have been formed on the backside of the substrate to provide electrical isolation. Standard processing steps are then employed to form a high k dielectric layer 220 on top of oxide layer 205, pattern the high k dielectric layer, and form tungsten studs 221 therein to facilitate thermal transfer to the substrate. At this point, all high temperature processes have been completed and the backside heat sink may be formed at any time. FIG. 9 depicts one embodiment of the completed semiconductor chip structure 200 wherein the thermal sink 280 may comprise copper or an evaporated metal liner formed on top of the backside oxide/nitride layers. Again, layers 230 above the high k dielectric 220 can be formed as described in the co-filed application, and ground plane 260 is optional and could be replaced with individual conductive bumps disposed atop the respective cooling posts 240, 247 as described above, or combined so as to be selectively placed in locations which do not have conductive bumps.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a semiconductor chip structure, said method comprising:

providing a substrate having first and second opposing surfaces;

forming at least one electrically conductive circuit member above said substrate on a dielectric layer, wherein said dielectric layer resides between said at least electrically conductive circuit member and said substrate, and having a low dielectric constant below approximately 3.5 and a first thermal conductivity;

disposing at least one thermal conductor thermally coupled to the at least one electrically conductive circuit member to provide a path for heat escape from said electrically conductive circuit member during operation, wherein said at least one thermal conductor has a second thermal conductivity, said second thermal conductivity being greater than said first thermal conductivity; and forming a thermal sink thermally coupled to said second surface of said substrate, wherein said at least one thermal conductor facilitates heat transfer from said at least one electrically conductive circuit member to said thermal sink.

2. The method of claim 1, wherein said forming the thermal sink comprises forming at least one thermally conductive via structure in the substrate in thermal contact with said at least one thermal conductor disposed above said substrate, wherein said at least one thermal conductor facilitates heat transfer from said at least one electrically conductive circuit member to said at least one thermally conductive via structure of said thermal sink.

3. The method of claim 2, wherein said forming the at least one thermally conductive via structure comprises forming multiple thermally conductive via structures in said substrate, said multiple thermally conductive via structures comprising thermally conductive cone-shaped via structures disposed in said substrate, at least one of which is aligned to thermally couple to said at least one thermal conductor disposed above said substrate.

4. The method of claim 2, wherein said at least one thermal conductor comprises at least one of a second dielectric material, polysilicon, and an electrically conductive material, and wherein said first thermal conductivity is less than ⅓ said second thermal conductivity, and said at least one thermal conductor is electrically isolated from said substrate.

5. The method of claim 1, further comprising electrically isolating said thermal sink from said substrate and from said at least one thermal conductor disposed above said substrate.

6. The method of claim 1, further comprising forming a silicon-on-insulator structure disposed above said first surface of said substrate at least partially between said at least one thermal conductor and said substrate, and wherein said method further comprises providing a thermal conduction path through said silicon-on-insulator structure from said at least one thermal conductor to said substrate.

7. The method of claim 5, wherein said providing said thermal conduction path through said silicon-on-insulator structure comprises forming a polysilicon plug, extending through said silicon-on-insulator structure and facilitating thermal coupling of said at least one thermal conductor to said thermal sink.

8. The method of claim 1, wherein said forming said thermal sink comprises patterning said second surface of said substrate and forming at least one via therein aligned to said at least one thermal conductor disposed above said first surface of said substrate, and subsequent thereto forming said thermal sink with at least one thermally conductive via structure residing in said at least one via formed in said substrate.

9. The method of claim 8, wherein said forming said thermal sink comprises providing an oxide/nitride layer over said second surface of said substrate and plating copper or an evaporated metal liner on top of said oxide/nitride layer, wherein said oxide/nitride layer provides electrical isolation of said thermal sink from said substrate.

10. The method of claim 1, wherein said forming at least one electrically conductive circuit member comprises forming multiple electrically conductive wiring levels above said substrate, each electrically conductive wiring level being formed on a different dielectric layer, each dielectric layer comprising said dielectric material having said low dielectric constant and said first thermal conductivity, and wherein said disposing comprises disposing at least one cooling post in thermal contact with at least one electrically conductive wiring level of said multiple electrically conductive wiring levels so that heat produced by said at least one electrically conductive wiring level during operation is transferred into the at least one cooling post for forwarding to said thermal sink disposed over said second surface of said substrate or for forwarding to an upper surface of said semiconductor chip structure.

11. The method of claim 10, wherein said disposing said at least one cooling post comprises fabricating said at least one cooling post from a plurality of thermally conductive plugs, each plug of said plurality of thermally conductive plugs being disposed in a different dielectric layer of said dielectric layers supporting said multiple conductive wiring levels.

12. The method of claim 11, wherein each thermally conductive plug comprises at least one of a second dielectric material, polysilicon, or an electrically conductive material.

* * * * *

UNITED STATES PATENT AND TRADEMARK OFFICE
CERTIFICATE OF CORRECTION

PATENT NO. : 6,773,952 B2
DATED : August 10, 2004
INVENTOR(S) : Armbrust et al.

It is certified that error appears in the above-identified patent and that said Letters Patent is hereby corrected as shown below:

<u>Title page</u>
Item [74], Inventors, delete the name "Ronald A. Kaschak" and insert -- William Steinberg, Esq. -- and delete the name "Lawrence R. Fraley, Esq.;" and insert -- Kevin P. Radigan, Esq. --

Signed and Sealed this

Thirtieth Day of November, 2004

JON W. DUDAS
*Director of the United States Patent and Trademark Office*